United States Patent [19]
Gwin

[11] Patent Number: 6,069,576
[45] Date of Patent: May 30, 2000

[54] SYNCHRO-TO-DIGITAL CONVERTER

[75] Inventor: William L. Gwin, King George, Va.

[73] Assignee: The United States of America as represented by the Secretary of the Navy, Washington, D.C.

[21] Appl. No.: 09/053,711

[22] Filed: Apr. 2, 1998

[51] Int. Cl.[7] ............................................. H03M 1/48
[52] U.S. Cl. ......................................... 341/112; 341/120
[58] Field of Search ....................................... 341/120, 112

[56] References Cited

U.S. PATENT DOCUMENTS

| | | | |
|---|---|---|---|
| 3,713,141 | 1/1973 | Higgins et al. | 340/347 SY |
| 3,866,214 | 2/1975 | Taylor | 340/347 |
| 4,703,307 | 10/1987 | James et al. | 340/347 SY |
| 4,933,674 | 6/1990 | Gasperi et al. | 341/116 |
| 4,973,974 | 11/1990 | Suzuki | 341/118 |
| 5,034,743 | 7/1991 | Deppe et al. | 341/116 |
| 5,063,383 | 11/1991 | Bobba | 341/120 |
| 5,121,119 | 6/1992 | Higuchi et al. | 341/120 |
| 5,317,542 | 5/1994 | Konopelski | 367/12 |
| 5,347,277 | 9/1994 | Nondahl et al. | 341/116 |
| 5,361,067 | 11/1994 | Pinckley | 341/120 |
| 5,659,312 | 8/1997 | Sunter et al. | 341/120 |

*Primary Examiner*—Brian Young
*Assistant Examiner*—Jason L W Kost
*Attorney, Agent, or Firm*—James B. Bechtel, Esq.; John P. McMahon, Esq.; George A. Smith, Jr.

[57] ABSTRACT

An advanced multi-channel synchro-to-digital converting device for delivering synchro data to a data bus, includes a digital-to-synchro synthesizer for generating synthesized analog synchro test signals, and switching for selectively substituting the synthesized synchro signals for synchro signals, with the selection of conversion channels and the magnitudes of the synthesized analog synchro signals both under the control of data on the data bus.

14 Claims, 6 Drawing Sheets

SYNCHRO-TO-DIGITAL CONVERTER

STATEMENT OF GOVERNMENT INTEREST

The invention described herein may be manufactured and used by or for the Government of the United States of America for Governmental purposes without the payment of any royalties thereon or therefor.

SUMMARY OF THE INVENTION

This invention relates generally to analog-to-digital conversion, and more particularly to improvements in devices for processing multi-channel synchro signals, e.g. analog synchro signals representing various ship's operating parameters such as speed, heading, pitch, roll, wind velocity, etc. Each of these analog signals is generated by a shipboard electromechanical transducer incorporating a synchro transmitter. The synchro transmitter is a transformer having three stator windings (usually in a "Y" configuration with three terminals) and a rotary shaft carrying a rotor winding. When an alternating excitation voltage is applied to the rotor winding, the magnitudes of the voltages between pairs of stator terminals and their phase (compared to that of the excitation voltage) uniquely define the angular position of the shaft. Thus, the output of a synchro transmitter is in the form of a.c. signals carried on five wires. Two of the wires carry an a.c. reference signal, which is the excitation signal applied to the rotor winding of the synchro. The other three wires are connected to the stator winding terminals.

To enable the analog synchro output signals to be processed by a digital computer, the signals must be converted to digital format. In the past, a preferred method of conversion was to utilize "Scott T" transformers to convert the synchro transmitter output signals to resolver format, and then convert the resolver format signals to digital format by "resolver-to-digital" conversion circuits. The resolver format signals were two signals having amplitudes proportional respectively to the sine and cosine of the shaft angle. The magnitude of these signals was typically only a few millivolts, a level far below the typically 90 volt (rms) level of the synchro outputs. The conversion circuits were designed for Multibus backplane architecture. Synchro transmitter data channels were read one at a time by a central processing unit, and the operation of the conversion circuitry was quite slow, the typical time required to read one channel in an eleven channel system was about 300 microseconds.

To test the conventional synchro-to-digital conversion circuit it was necessary to provide externally generated signals corresponding to known angle values, and feed them into the converters instead of the synchro transmitter signals. Such testing was time-consuming because of the need for manually connecting externally generated test signals to the converters.

The principal object of this invention is to simplify testing of plural synchro-to-digital converters in a multi-channel device. It is also an object of the invention to eliminate the need for externally generated synchro test signals, to eliminate manual connection of the test signals to the synchro-to-digital converters, and to enable testing of plural converter channels to be carried out more rapidly, under software control.

The multi-channel synchro-to-digital converting device in accordance with the invention comprises: a data bus; plural synchro-to-digital conversion channels having outputs connected to the data bus; a digital-to-synchro converter having an input connected to the data bus, and responsive to predetermined bits on the data bus, and having an analog output in the form of a synthesized analog synchro transmitter output; and switching means, responsive to other predetermined bits on the data bus, for alternatively connecting each synchro-to-digital conversion channel either to the output of a synchro transmitter or to said analog output of the digital-to-synchro converter. For testing, the synthesized analog output of the digital-to-synchro converter can be substituted for synchro signals in selected conversion channels, with the selection of conversion channels and the magnitudes of the synthesized analog synchro signals both under software control, the control signals being in the form of data received through the data bus.

Other objects, details and advantages of the invention will be apparent from the following detailed description when read in conjunction with the drawings.

DETAILED DESCRIPTION

The device in accordance with this invention is a single, VMEbus slave device that conforms to ANSI/IEEE Standard 1014–1987, Versatile Backplane Bus: VMEbus, a bus capable of supporting data transfers of as many as thirty two bits. The device is capable of converting as many as twelve channels of 90 volt (rms), 400 Hz. synchro signals to digital format. It is intended for use in conjunction with a computer such as a Motorola MVME167 single board computer, which serves as a VMEbus controller and primary processor.

The components which carry out the analog-to-digital conversion of the synchro transmitter signals are integrated circuit synchro-to-digital converter modules, each capable of converting two channels of synchro transmitter output signals to digital format. A suitable converter is the dual-channel synchro-to-digital converter available from ILC Digital Device Corporation under part number SDC14622-304. Six such dual-channel converters are shown in FIG. 1 at 10, 12, 14, 16, 18 and 20.

The outputs of the converters 10–20 are connected to a 32 bit local data bus 22. The output of each converter consists of 16 bits, and the outputs of converters 10, 14 and 18 are connected to the conductors 24 of the data bus, which are designated for the lower sixteen bits of the thirty two bits of data. The outputs of converters 12, 16 and 20 are connected to conductors 26, for the upper sixteen bits.

Figure 1:
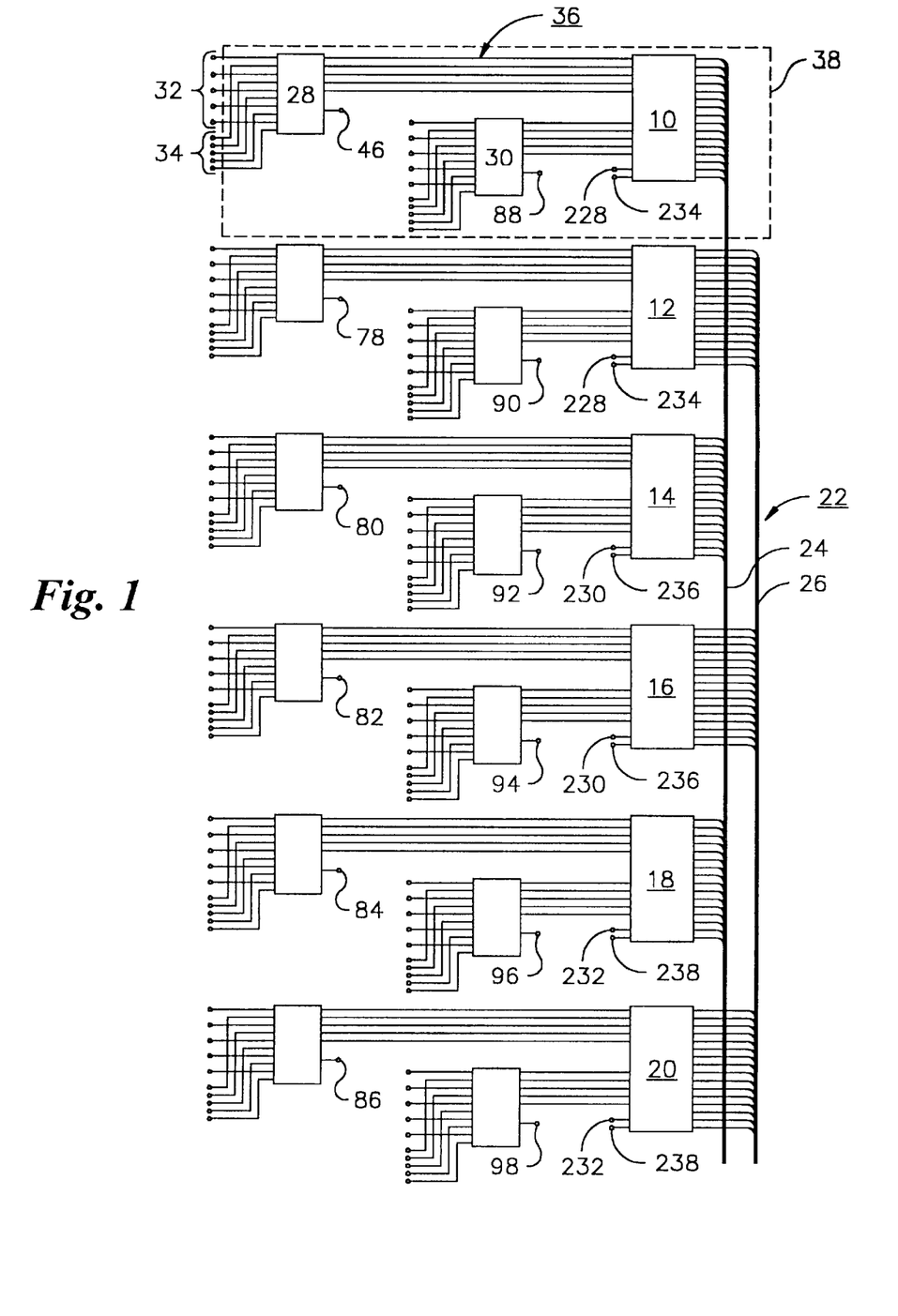
FIG. 1 is a schematic diagram showing an array of integrated circuit synchro-to-digital converters having their outputs connected to a bus, together with relays for switching synthesized synchro transmitter signals into the inputs of the converters.

FIG. 1 shows that each of the dual-channel converters is associated with two relay modules, for example modules 28 and 30, which are associated with dual-channel converter 10. The purpose of these relay modules is to substitute synthesized synchro signals for the output signals of the electromechanical synchro transmitters to which the converters are normally connected. Relay module 28, for example selects either the output signals of a synchro transmitter on lines 32, or synthesized synchro signals on synchro test input lines 34, delivering the selected set of signals through lines 36 to converter 10.

Figure 2:
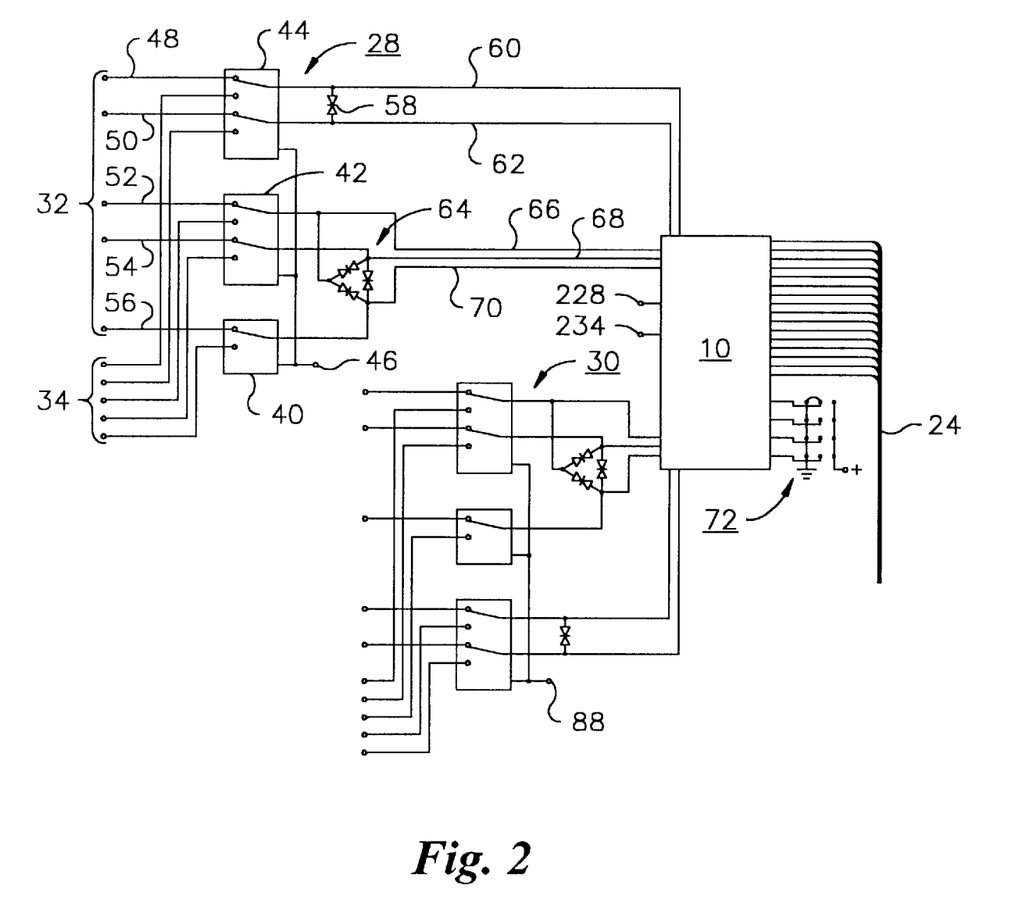
FIG. 2 is a schematic diagram illustrating one of the converter modules of FIG. 1 and details of the relays associated with the converter module.

The assembly comprising converter 10 and relay modules 28 and 30, outlined by box 38 in FIG. 1, is shown in greater detail in FIG. 2. Each relay module 28 and 30 is composed of three separate electromechanical relay units, one being a single pole, double throw (SPDT) unit 40, and the other two being double pole, double throw (DPDT) units 42 and 44. The relay magnets (not shown) are controlled by current at control terminal 46. Lines 32, lines 48 and 50 are rotor signal lines, and lines 52, 54 and 56 are stator signal lines. A bidirectional surge suppressor 58 is provided between the output conductors 60 and 62 of relay unit 44. A set 64 of three bidirectional surge suppressors is also provided, there being one suppressor between each pair of output lines 66, 68 and 70 of relay units 40 and 42. Relay module 30 is similar to relay module 28.

Jumpers terminals 72 are provided on the converter 10 to permit selection of resolution. For example, in ILC converter part number SDC14622-304, it is possible to select ten, twelve, fourteen or sixteen bit digital resolution, for tracking rates of 160, 40, 10 and 2.5 revolutions per second respectively.

The set of six dual-channel converters, presents angle values corresponding to synchro shaft positions to the data bus two channels at a time, in the form of a 32 bit longward. The lower 16 bits of the 32 bit longword are supplied by one of the converters 10–20, and the upper 16 bits are supplied by another one of the converters. The paired outputs appear in six contiguous addresses starting at a base address of the device. Each 32 bit longward is read with one quad-byte read operation over the data bus 22. Only six such read operations are required to obtain synchro data from all twelve channels.

Figure 3:
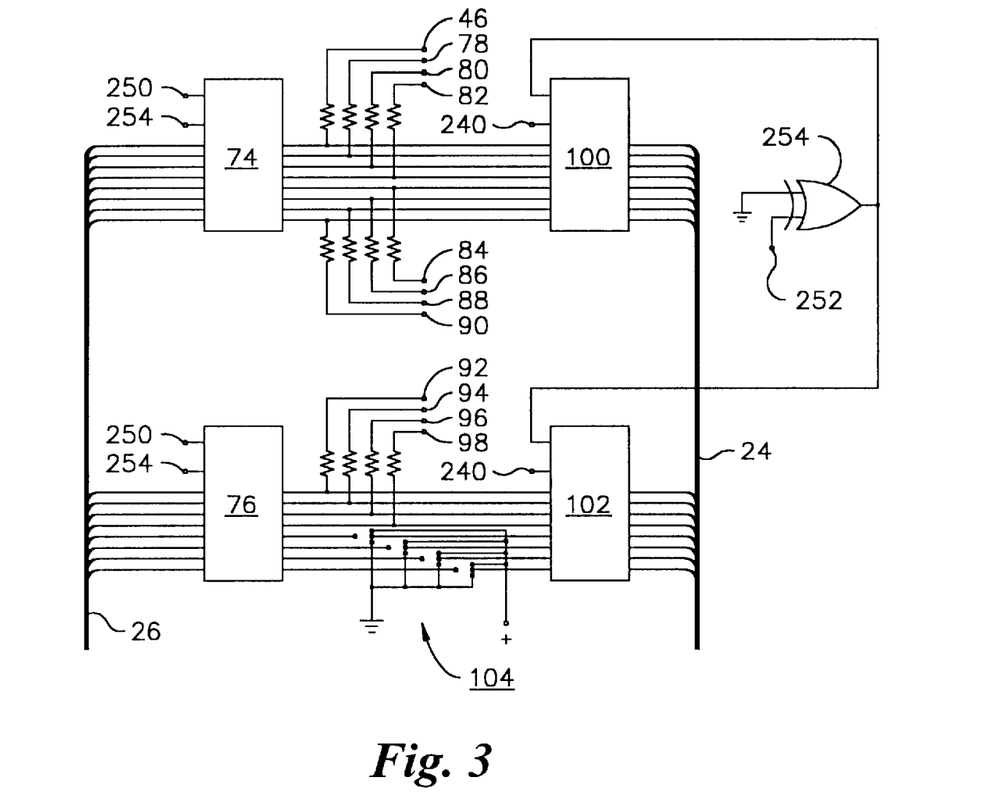
FIG. 3 is a schematic diagram showing relay control drivers and relay status registers.
Figure 4:
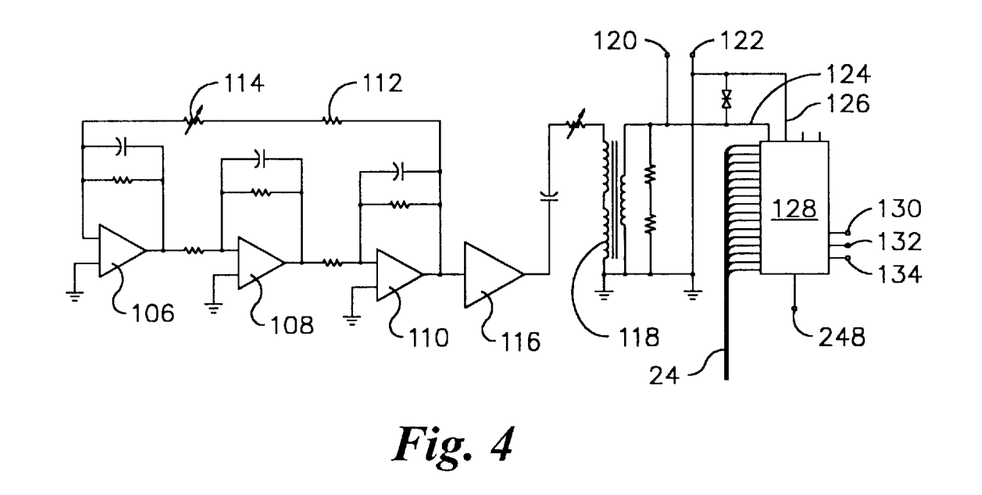
FIG. 4 is a schematic diagram of a synchro transmitter signal synthesizer.

As mentioned previously, for testing, the relay modules substitute synthesized synchro signals for output signals of the electromechanical synchro transmitters to which the converters are normally connected. The angle values of the synthesized synchro signals and the operation of the relay modules are determined by a 32 bit longward transmitted over the data bus. FIG. 3 illustrates how relay selection signals are derived, and FIG. 4 illustrates how synthesized synchro signals are generated.

As shown in FIG. 3, the conductors 26 for the upper sixteen bits on the data bus are connected to the inputs of two octal D-type flip-flop modules 74 and 76. These flip-flop modules temporarily store relay selection data received from the data bus and clocked into them by a "write" signal. The flip-flop modules produce twelve relay control outputs at terminals 46 and 78–98. The same terminals appear in FIG. 1 at the relay control inputs.

A second pair of octal D-type flip-flop modules 100 and 102 serve as a relay control signal status register, delivering relay control status data back to the data bus on conductors 26, which carry the lower sixteen bits of bus data.

As will be apparent, relay selection utilizes twelve of the sixteen available bits in bus conductors 26, and relay status likewise uses twelve of the sixteen available bits in bus conductors 24. Jumper terminals 104 allow the user to set any or all of the remaining four bits in bus conductors 24 "high" or "low", for example for circuit board identification. Alternatively, the user can program the state of any or all of these four bits through data on the four bits of bus conductors 26 which are not used for relay selection.

The synthesized synchro signals are generated by the circuit shown in FIG. 4. This circuit comprises an oscillator, which generates an ac rotor signal, and an integrated circuit, digital-to-synchro converter for digital synthesis of three synchro stator signals.

The rotor signal, typically a 400 Hz. 70 volt (peak to peak) ac signal, is produced by an oscillator comprising three operational amplifiers 106, 108 and 110 with a feedback connection through resistors 112 and 114. Amplifiers 106 and 108 introduce the phase shift needed for sustained oscillation at 400 Hz. The output of the oscillator is amplified by amplifier 116, and delivered through transformer to terminals 120 and 122.

The secondary of transformer 118 is also connected to reference inputs 124 and 126 of digital-to-synchro converter 128, which is preferably an ILC converter No. DSC11520-314, available from ILC Digital Device Corporation. This device delivers synthesized synchro stator signals at terminals 130, 132 and 134. The angle values of the synchro signals are programmed by sixteen bits of digital data in bus conductors 24.

The synthesized synchro signals are provided on five output terminals, the rotor signal being on terminals 120 and 122, and the stator signals on terminals 130, 132 and 134. These five terminals are connected to the synchro test input lines 34 of relay module 28 (FIGS. 1 and 2) and also to corresponding synchro test input lines associated with each of the other eleven relay modules in FIG. 1.

The synchro-to-digital conversion device will ordinarily be one of several similar devices all under computer control. Addressing of these devices by the computer is decoded by programmable logic arrays (PALs) in FIG. 5. The backplane of the computer is connected to pins 136, 138, 140 and 142 of octal D-type latches 144, 146, 148 and 150 respectively. Each of these latches also receives a clock input from the backplane of the computer through a clock input terminal 152.

Figure 5:
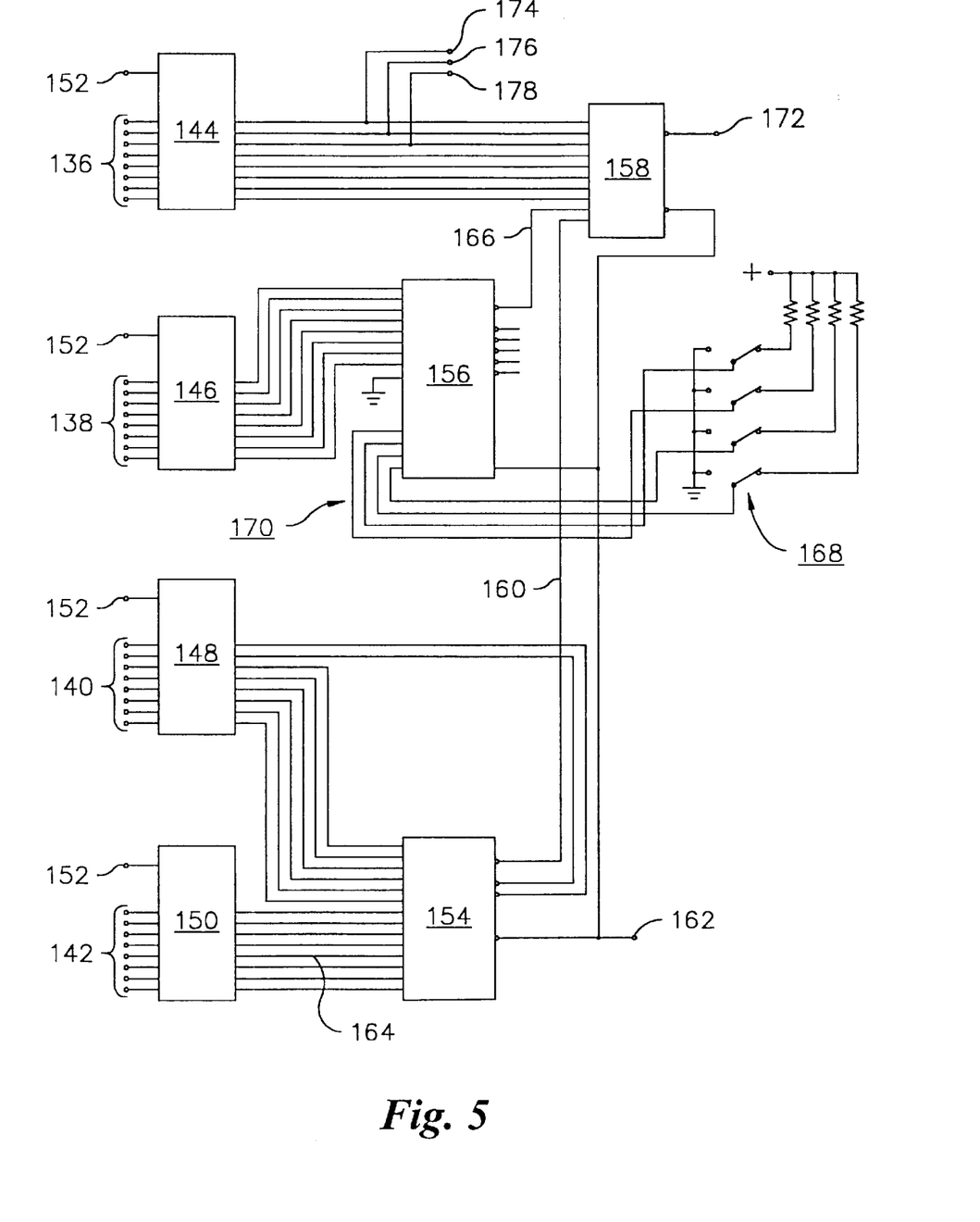
FIG. 5 is a schematic diagram of addressing circuitry for the multi-channel synchro-to-digital converter.

Three PALs, 154, 156 and 158 are provided. PAL 154 decodes sixteen address bits derived from terminals 140 and 142 through latches 148 and 150. It sends a signal through line 160 to PAL 158 when its two input bytes are in a specific predetermined state and a validating signal is presented to terminal 162. The specific predetermined state of the two input bytes of PAL 154 which allows it to send a signal through line 160 can be, for example, a condition in which only input bit in line 164 is "high" and all of the remaining fifteen input bits are "low", i.e. a condition in which the input bits are in the form of the binary number 0001000000000000. This specific predetermined condition does not change, because, in addressing the device, only three of the bits at the inputs of PAL 144 change state.

PAL 156 decodes eight address bits derived from terminals 138 through latch 146, and sends a signal through line 166 to PAL 158 when its eight input bits are in a specific predetermined state, and a validating signal is also present at terminal 162.

The base address of the device can be set to any of sixteen different values by selectively setting four of the input bits of PAL 144 either "high" or "low" by means of switches 168. The base address is normally the hexadecimal number 10000000 when all of the four address setting inputs 170 are "high", and is incremented in hexadecimal steps of 1000 for sixteen possible base addresses, by operating the four switches 168 in a binary countdown fashion.

Terminal 172 at an output of PAL 158 carries a valid address signal. It can only do so when the signals in lines 160 and 166 indicate that PALs have decoded their address bits and the validating signal is present at terminal 62. Pins 174, 176 and 178 carry address information to other components of the device.

Figure 6:
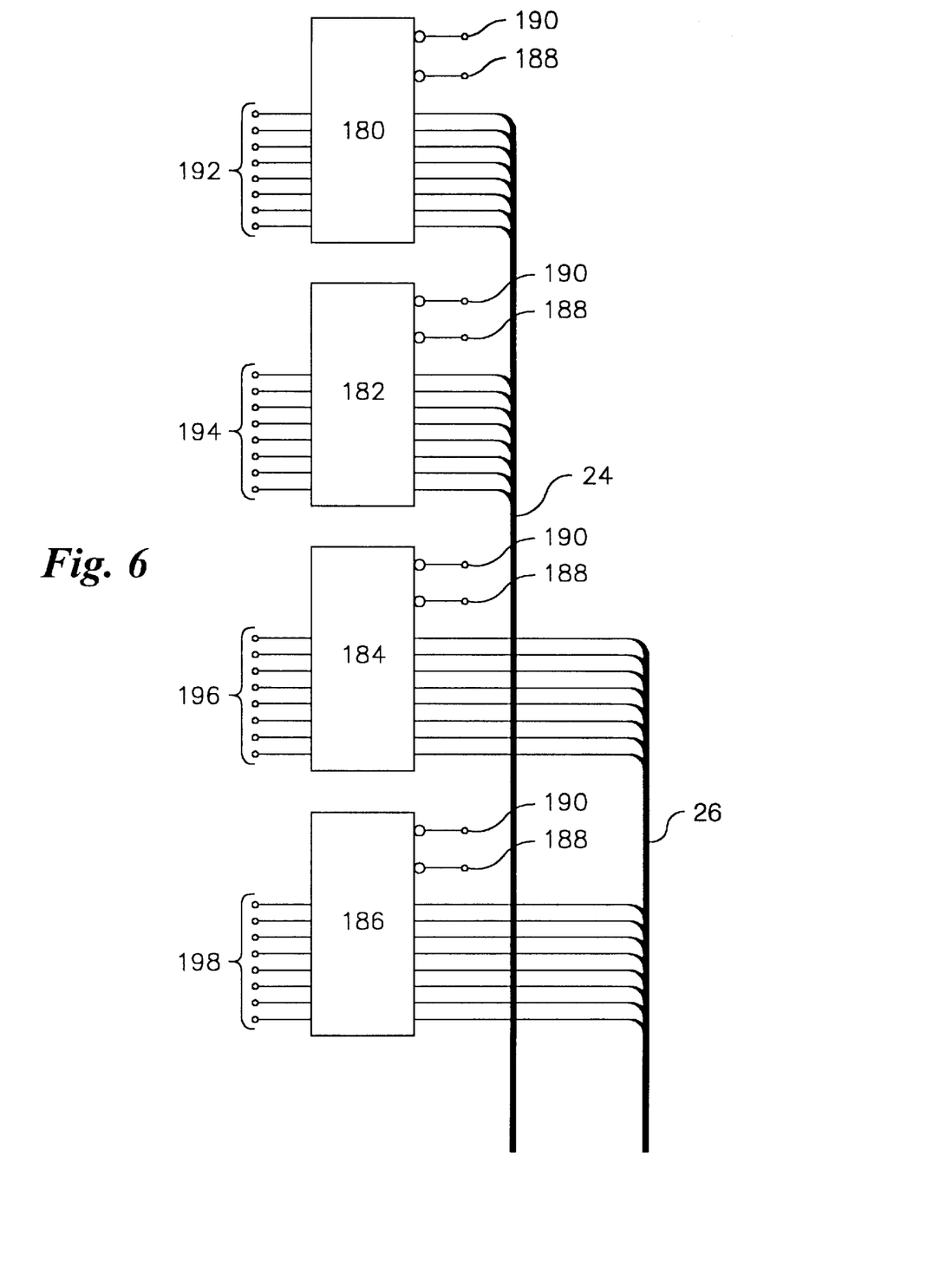
FIG. 6 is a schematic diagram of a set of transceiver modules for transferring data from the bus to a computer backplane.

The four devices 180, 182, 184 and 186 in FIG. 6 are SN74F245N two-way data transceivers for carrying data from the backplane of the computer to the bus and from the bus to the backplane of the computer. The transceivers are controlled by read/write signals at terminals 188 and valid access signals at terminals 190. Pins 192, 194, 196 and 198 are connected to the computer backplane.

Figure 7:
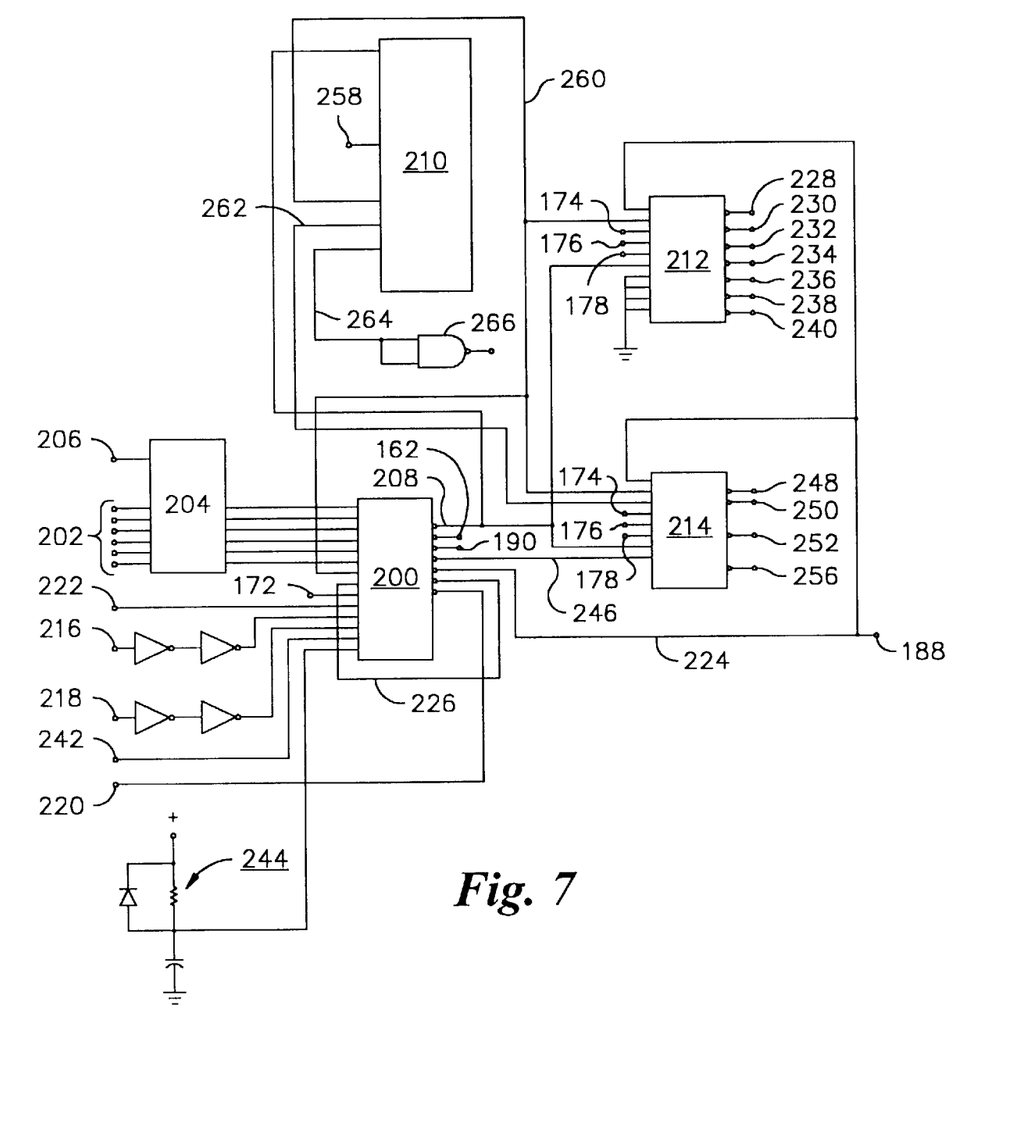
FIG. 7 is a schematic diagram of the control logic for the synchro-to-analog converter.

Device 200 in FIG. 7 is a PAL which performs several functions. A first function is the decoding of an address modifier code derived through pins 202 on the computer backplane through an octal D-type latch 204 having a clock input pin 206. The address modifier codes provide for several levels of data or program access.

A second function of the PAL 200 is to start a read or write transaction by producing a signal at its output 208. This output initiates operation of a shift register 210, which controls the timing of the events in a read or write transaction. The signal at output 208 of PAL 200 is also delivered to PALs 212 and 214, which control various read and write operations. The signal must be in a logical "high" state for PALs 212 and 214 to respond to outputs of the shift register 210.

A third function of PAL 200 is to ensure that certain bus signals are in their proper and expected state before producing a signal at output 208. These bus signals are data strobe signals at terminals 216 and 218 and an interrupt acknowledgment signal at terminal 220.

The PAL 200 also passes the state of the "write" signal received from the bus at terminal 222 as a read/write signal to PALs 212 and 214 through line 224.

The read/write signal at line 224 is derived from the signal at terminal 222 by first producing an inverted read/write signal in line 226, feeding the inverted signal back through line 226 to another input of PAL 200, and reinverting the signal within PAL 200 to produce the output signal at line 224. This introduces a delay in the read/write signal, which is needed to prevent the read/write signal in line 224 from being negated before the signal in line 208 is negated, which would cause an unwanted signal at terminal 228 at the output of PAL 212.

Output 228 of PAL 212 is one of six sequentially operated "read" outputs 228, 230, 232, 234, 236 and 238 of PAL 212, connected to the synchro-to-digital converters 10–20 as shown in FIG. 1. A seventh output 240 is connected, as a "read" input, to the octal flip-flops 100 and 102 (FIG. 3), which serve as relay control status registers.

A fifth function of PAL 200 is to provide the "valid access" signal at terminal 190 to enable the transceivers in FIG. 6, and to provide the read/write signal through terminal 188 to the transceivers.

The sixth and final function of PAL 200 is to monitor a "system reset" signal on the bus received at terminal 242, and a local "power reset" signal delivered by circuit 244. If either or both of these reset signals are asserted, PAL 200 delivers a local reset signal to PAL 214, through line 246.

PAL 214 generates the strobe signals that clock data into various components during "write" transactions. When output terminal 248 of PAL 214 goes "high" it allows bus data to be written to the digital-to-synchro converter 128 (FIG. 4), and when it goes "low" it causes the data in the converter 128 to be latched. When output terminal 250 goes "high" it clocks data into the relay selection storage flip flop modules 24 and 76 (FIG. 3). When output terminal 252 goes "high" a delay is introduced by an exclusive OR gate 254 (FIG. 3), and the delayed signal clocks the current state of relay status registers 100 and 102 to their outputs during a relay status "read" transaction.

PAL 214 produces an delayed reset signal at terminal 256, which resets the relay control registers 74 and 76 (FIG. 3) to their initial states when the system power is turned on or upon a system reset.

Shift register 210 receives clock pulses at terminal 258, and sequentially activates lines 260, 262 and 264. Line 260 carries a signal to PALs 212 and 214 signifying the start of a "read" or "write" transaction. Line 262 carries a signal to PAL 214 signifying the end of a "write" transaction. Line 264 sends an acknowledgment signal to the VME bus on the computer backplane through a gate 266.

The sequence of a "read" transaction will now be described. A "read" transaction is one in which digitized synchro data is transferred through the transceivers of FIG. 6 from the local data bus (24, 26) to the VME data bus on the computer backplane. It will be assumed that the interrupt acknowledge signal at terminal 220 is at a logical "high," indicating that no interrupt routine is in progress. It will also be assumed that no system reset is in progress and therefore the system reset signal at terminal 242 is at a logical "high." The outputs of shift register 210 are cleared to a logical "low" by a logical "low" at output 208 of PAL 200.

Initially, the bus master of the computer places a correct address modifier code on the address bus. At the same time, the bus master places the base address on the address bus and asserts a logical "low" at the fourth (from the top) of terminals 136 in FIG. 5. This logical "low" signifies quad-byte memory access.

Thereafter, the bus master asserts an address strobe at terminal 206. At this time, in a "read" transaction, terminal 222 remains at a logical "high". the bus master than asserts data strobe signals at terminals 216 and 218, which are "low" for quad-byte memory access. This causes PAL 200 to set the validating signal at terminal 162 to a logical "high". On the falling edge of the address strobe at terminal 206, the address and the signal on the fourth input of latch 144 are held by latches 144–150, and the address appears at the outputs of these latches. The signals at terminals 174–178 (FIG. 5), which are "low" for the base address, are presented at the correspondingly numbered input terminals of PALs 212 and 214. At the same time, an address modifier code at input terminals 202 is latched by device 204 (FIG. 7). At this point PAL 200 is looking for a valid latched address modifier code, and the read/write signal at terminal 188 is at a logical "high" because the "write" signal at terminal 222 is at a logical high.

PALs 154 and 156 (FIG. 5) detect valid address information in three of the four address bytes, and inform PAL 158 through lines 160 and 166. PAL 158, also receiving a validation signal at terminal 162, and a valid address byte at terminals 136, produces a valid address signal at terminal 172, which is received by PAL 200 (FIG. 7). Since the address modification code, the data strobes and interrupt acknowledge are all true, PAL 200 produces an output in line 208.

Although the signal in line 208 is received by PALs 212 and 214, nothing happens at this time because the "start read/write" signal from the shift register output line 260 is still "low".

The "start read/write" output of the shift register 210 is an output of a third stage of the shift register. Thus, first and second clock pulses produce no result. This feature introduces a delay to ensure that all signals that have changed state up to this point are stable. The third clock pulse, causes the "start read/write" signal to be transmitted by the shift register, through line 260, to PALs 212 and 214 and 200.

When PAL 200 detects the "start read/write" signal, since the valid address signal at terminal 172, the data strobe signals at terminals 216 and 218 are already true, and the address modifier code is valid, PAL 200 sends a "valid access" signal through its output terminal 190 to the transceivers 180–186 in FIG. 6.

PAL 214 detects the "start read/write" signal on line 260, but does not respond, since it-is programmed to respond only when the bits at terminals 174, 176 and 178 correspond to a hexadecimal "7".

PAL 212 also detects the "start read/write" signal. It is programmed to produce a signal at terminal 228 if the "read/write" signal at terminal 199, the "start read/write" signal at line 260 and the signal in line 208 are all at a logical "high" and the bits at terminals 174, 176 and 179 are correspond to a hexadecimal "0".

The transceivers in FIG. 6 detect a "valid access" signal at terminals 190, as generated by PAL 200. Since the "read/write" terminals 188 are at a logical "high", the transceivers are enabled to pass data from the local data bus (24, 26) to the VME data bus at terminals 192–198.

One of the two channels of each of the synchro-to-digital converters 10 and 12 (FIG. 1) detects the signal at terminal 228 (FIG. 7), an the digital outputs of these converters are enabled. the current synchro data is latched internally in the converters and presented at the digital outputs.

The shift register 210 then receives another clock pulse, causing it its output line 262 to go "high". This is an "end write" signal, which does nothing in a "read" transaction. However, another clock pulse to the shift register causes line 264 to go "high", causing the signal at the output of gate 266 to go "low". The output of the gate informs the data bus on the computer backplane that the data requested is on the data bus (24, 26) and may be read. The delay caused by the two steps in the shift register allows the converter outputs to stabilize before the data is read.

When the bus master latches the data into its internal registers, it negates the data strobe signals at terminals 216 and 218 (FIG. 7), and also negates the clock at terminal 206 of latch array 204.

When a first data strobe rising edge from terminal 216 or 218 is detected by the PAL 200, the PAL negates the signal at its outputs 208, 162 and 190. The negated output at 208 resets the shift register, causing all of its outputs, at lines 260, 262 and 264 to go "low". The negated output at 208 also negates the output at terminal 228, disabling the digital outputs of converters 10 and 12 (FIG. 1). The negated "data strobe valid" signal at terminal 162 negates the signals in lines 160, and 166 and the "valid address" signal at output terminal 172 in FIG. 5. The negated "valid access" signal returns the transceivers in FIG. 6 to a condition in which they isolate the local data bus from the VME data bus. At this time all of the circuits are ready for another transaction.

A typical "write" transaction will now be described. A "write" transaction is one in which data from the VME bus is transferred to components on the local bus, for example the digital-to-synchro converter 128, or the relay control registers 74 or 76 (FIG 3). Here again it will be assumed that the "interrupt acknowledge" signal at terminal 220 (FIG. 7) is at a logical "high," indicating that no interrupt routine is in progress. It will also be assumed that no system reset is in progress and therefore the system reset signal at terminal 242 is at a logical "high". The outputs of the shift register 210 will be cleared to a logical "low" because the signal in line 208 is at a logical "low".

As in the case of a "read" transaction, initially, the bus master places a correct address modifier code on the address bus. At the same time, the bus master places the base address on the address bus and asserts a logical "low" at the fourth (from the top) of terminals 136 in FIG. 5. The bus master asserts an address strobe at terminal 206 (FIG. 7).

The bus master asserts a "write" at terminal 222 (FIG. 7) and places data on the data bus through the transceivers in FIG. 6. Assume that the data is a hexadecimal "1", which corresponds to an assertion at the uppermost one of terminals 192 in FIG. 6, and a negation at all of the other terminals of groups 192–198. From this point up to the assertion of the "valid access" signal at terminal 190, the operation is the same as in a "read" transaction.

At this time PAL 212 (FIG. 7), which is programmed to respond only to "read" transactions, does nothing in response to the "start read/write signal" received from the shift register 210 through line 260. However, PAL 214 asserts an output at terminal 252.

The transceivers in FIG. 6 detect the "valid access" signal from PAL 200 at terminal 190. At this time, since the read/write signal at terminal 188 is "low", the transceivers are enabled to pass data from the VME data bus on the computer backplane to the local data bus 24, 26. The local data bus is now driven by the bus master and the data appears on the local data bus.

The shift register then sends an "end write" signal, as a logical "high", through line 262 to PAL 214, which in turn negates its output at terminal 252. This signal can be used to clock data into an indicating register (not shown) to activate an LED, for example. Data is clocked into the digital to synchro converter 128 (FIG. 4) by an output at terminal 248 in a similar manner. Likewise when output terminal 250 goes "high" it clocks data into the relay selection storage registers 74 and 76 (FIG. 3).

Another step in the operation of the shift register produces a signal in line 264 (FIG. 7), informing the bus master that the device has successfully received data. The data strobes at terminals 216 and 218 are then negated, and the negation of the first data strobe is detected by PAL 200, which in turn negates the outputs at line 208 and terminals 162 and 190. The negated output at line 208 resets the shift register causing all of its outputs to go "low".

The negated output at terminal 162 (FIG. 5) causes PALs 154, 156 and 158 to negate their outputs at lines 160, 166 and 172 respectively. The negated "valid access" signal at terminal 172 places the transceivers into a condition in which they no longer pass data between the local data bus and the VME data bus. Again, all circuits are reset and ready for another transaction.

As will be apparent, the principal advantages of the invention are that it provides for rapid computer-controlled acquisition of multi-channel synchro data, and for computer-controlled synthesis and switching of test synchro signals generated by an on-board synthesizer. All of the components may be conveniently mounted on a single circuit board.

Various modifications can be made to the apparatus described. For example, the number of synchro data channels can be any desired number and other configurations of the relays and the control circuits of FIGS. 5 and 7 can be used. These and other modifications can be made to the apparatus and method described above without departing from the scope of the invention as defined in the following claims.

I claim:

1. A device for converting multi-channel, analog synchro transmitter output signals to digital format comprising:

a data bus;

a plurality of synchro-to-digital conversion channels having outputs connected to the data bus;

a digital-to-synchro converter having an input connected to the data bus, and responsive to predetermined bits on the data bus, and having an analog output in the form of a synthesized analog synchro transmitter output; and switching means, responsive to other predetermined bits on the data bus, for alternatively connecting each synchro-to-digital conversion channel either to the output of a synchro transmitter or to said analog output of the digital-to-synchro converter;

whereby, for testing, the synthesized analog output of the digital-to-synchro converter can be substituted for synchro signals in selected conversion channels, with the selection of conversion channels and the magnitudes of the synthesized analog synchro signals both under the control of data on the data bus.

2. A device according to claim 1 including means for sequentially strobing data from the synchro-to-digital conversion channels onto the data bus.

3. A device according to claim 1 including means for sequentially strobing data from the synchro-to-digital conversion channels onto the data bus two conversion channels at a time.

4. A device according to claim 1 in which the switching means comprises electromechanical relays.

5. A device according to claim 1 in which each synchro-to-digital conversion channel comprises two rotor signal input terminals and three stator signal input terminals.

6. A device according to claim 1 in which each synchro-to-digital conversion channel comprises two rotor signal input terminals and three stator signal input terminals, and in which the output of the digital-to-synchro converter includes three digitally synthesized stator signals.

7. A device according to claim 1 in which each synchro-to-digital conversion channel comprises two rotor signal input terminals and three stator signal input terminals, and in which the output of the digital-to-synchro converter includes three digitally synthesized stator signals and an analog rotor signal.

8. A device for converting multi-channel, analog synchro transmitter output signals to digital format comprising:

a data bus;

a plurality of sets of synchro input terminals each set being capable of receiving output signals from a different one of a plurality of synchro transmitters;

a plurality of integrated circuit synchro-to-digital converters, each establishing a separate conversion channel, each synchro-to-digital converter having a set of inputs for receiving analog synchro transmitter output signals for a single synchro transmitter, and the synchro-to-digital converters having outputs connected to the data bus;

a digital-to-synchro converter having an input connected to, and responsive to predetermined bits on, the data bus and having an analog output in the form of a synthesized analog synchro transmitter output;

relay means comprising a relay for each conversion channel, each relay having a control input and having a switch connected to one set of said plural sets of synchro input terminals, to the inputs of the synchro-to-digital converters, and to the output of the digital-to-synchro converter, for alternatively connecting the inputs of each synchro-to-digital converter either to a set of said synchro input terminals or to the output of the digital-to-synchro converter;

driving means connected to the control input of the relay means for each conversion channel, the driving means also being connected, and responsive, to a predetermined set of bits on the data bus, for selectively operating the relays, whereby, for testing, the synthesized analog output of the digital-to-synchro converter can be substituted for the synchro signals from the synchro input terminals in selected conversion channels, with the selection of conversion channels and the magnitudes of the synthesized analog synchro signals both under the control of data on the data bus.

9. A device according to claim 8 including means for sequentially strobing outputs from the synchro-to-digital converters onto the data bus.

10. A device according to claim 8 including means for sequentially strobing outputs from the synchro-to-digital converters onto the data bus two conversion channels at a time.

11. A device according to claim 8 in which the relays are electromechanical relays.

12. A device according to claim 8 in which each set of synchro input terminals comprises two rotor signal terminals and three stator signal terminals.

13. A device according to claim 8 in which each set of synchro input terminals comprises two rotor signal terminals and three stator signal terminals, and in which the output of the digital-to-synchro converter includes three digitally synthesized stator signals.

14. A device according to claim 8 in which each set of synchro input terminals comprises two rotor signal terminals and three stator signal terminals, and in which the output of the digital-to-synchro converter includes three digitally synthesized stator signals and an analog rotor signal.

* * * * *